(12) United States Patent
Boescke et al.

(10) Patent No.: US 7,709,359 B2
(45) Date of Patent: May 4, 2010

(54) INTEGRATED CIRCUIT WITH DIELECTRIC LAYER

(75) Inventors: Tim Boescke, Dresden (DE); Johannes Heitmann, Dresden (DE); Uwe Schroder, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/850,218

(22) Filed: Sep. 5, 2007

(65) Prior Publication Data

US 2009/0057737 A1   Mar. 5, 2009

(51) Int. Cl.
*H01L 29/72* (2006.01)

(52) U.S. Cl. .................... 438/486; 438/3; 438/287; 438/482; 438/783; 438/785

(58) Field of Classification Search .......... 438/3, 438/287, 482, 486, 783, 785
See application file for complete search history.

(56) References Cited

U.S. PATENT DOCUMENTS

| 5,728,603 | A  | * | 3/1998  | Emesh et al. ............... 438/3 |
| 2002/0149040 | A1 | * | 10/2002 | Sun et al. ................ 257/295 |
| 2005/0202222 | A1 |   | 9/2005  | Cartier et al. |
| 2006/0051978 | A1 |   | 3/2006  | Li et al. |
| 2006/0243194 | A1 |   | 11/2006 | Sandhu et al. |

* cited by examiner

*Primary Examiner*—Edward Wojciechowicz
(74) *Attorney, Agent, or Firm*—Dicke, Billig & Czaja, PLLC (57) ABSTRACT

A method of fabricating an integrated circuit with a dielectric layer on a substrate is disclosed. One embodiment provides forming the dielectric layer in an amorphous state on the substrate, the dielectric layer having a crystallization temperature; a doping the dielectric layer; a forming of a covering layer on the dielectric layer at a temperature being equal to or below the crystallization temperature; and a heating of the dielectric layer to a temperature being equal to or greater than the crystallization temperature.

23 Claims, 10 Drawing Sheets

INTEGRATED CIRCUIT WITH DIELECTRIC LAYER

BACKGROUND

Demands imposed on large scale integrated circuits, such as electronic memory devices, microprocessors, signal-processors and integrated logic devices, are constantly increasing. In the case of electronic memory devices, those demands mainly translate into enlarging storage capacity and into increasing access speed. As far as modern memory devices are concerned, the computer industry has established, amongst others, the DRAM (Dynamic Random Access Memory) as an economic means for high speed and high capacity data storage.

Although a DRAM requires continuous refreshing of stored information, speed and information density, combined with a relatively low cost, have put the DRAM to a pivotal position in the field of information technology. Almost every type of computer system, ranging, for example, from PDAs over note-book computers and personal computers to high-end servers, takes advantage of this economic and fast data storage technology. Nevertheless, the computer and electronic industry develops alternatives to the DRAM, such as phase change RAM (PC-RAM), conductive bridging RAM (CB-RAM), and magnetic resistive RAM (M-RAM). Other concepts include the flash-RAM or static RAM (S-RAM), which have already found their established applications.

In order to increase the storage capacity of, for example, a memory device, the computer industry aims to reduce the minimum feature size. This translates into a miniaturization of the involved electronic entities, such as transistors, capacitors, resistors, and/or signal lines. Hereby, many electronic entities involve a dielectric element or a dielectric layer. Examples include a transistor, which comprises a gate-electrode, separated from a transistor channel by a dielectric layer. Furthermore, a capacitor comprises a dielectric layer which is arranged in between two facing electrodes. Often, it is desirable to maximize the dielectric constant of the dielectric material of the dielectric element and/or dielectric layer. This may result into an enhanced capacity, while, at the same time, being able to reduce the feature and/or electrode area. Also, it may be desirable to reduce leakage currents through the dielectric material of an dielectric element and/or layer.

As part of efforts to increase the dielectric constant of a dielectric material, the high-k-materials are subject to intense industrial and scientific research. Such materials may be defined as having a dielectric constant which is greater than the dielectric constant of silicon dioxide. Examples for high-k-materials include transition metal oxides, zirconium, hafnium-oxide, lead zirconium titanate, tantalum oxide, silicon nitride, and/or barium strontium titanate. However, there is still need for increasing the dielectric constant of dielectric materials, dielectric elements, and/or dielectric layers.

Various embodiments of the present invention may provide particular advantages for an improved method of fabricating a dielectric layer, an improved method of fabricating an integrated circuit, an improved dielectric layer, and an improved integrated circuit.

SUMMARY

One embodiment includes an integrated circuit with a dielectric layer. The dielectric layer is in a crystalline state and stressed.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
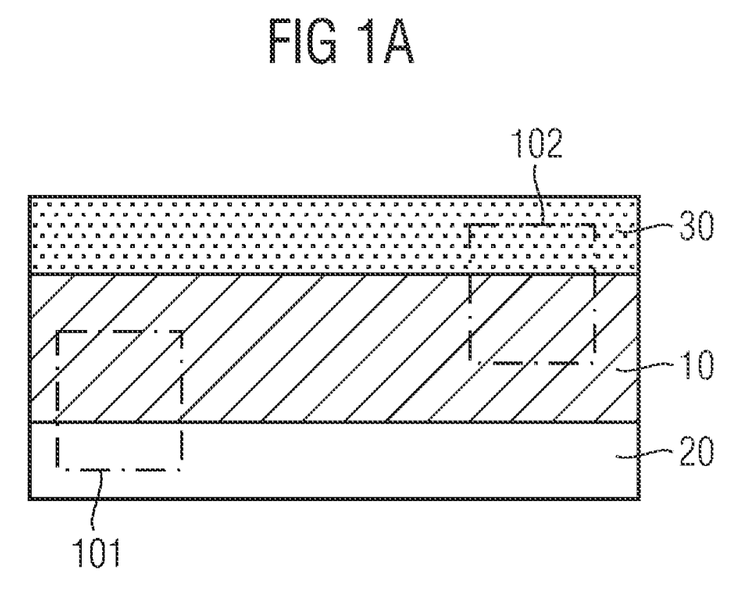
FIGS. 1A and 1B illustrate schematic views of a dielectric layer according to embodiments.

FIG. 1A illustrates a schematic view of an arrangement with a dielectric layer, according to one embodiment. A dielectric layer 10 is arranged on a substrate 20, which may include a semiconductor substrate, a semiconductor substrate with electronic entities, an electrode, or a substrate with an electrode region or electrode layer. Electronic entities may include transistors, resistors, capacitors, diodes, conductors, insulators, light emitting diodes, semiconductor lasers, and/or light sensors. On the dielectric layer 10 there is arranged a covering layer 30, which may include a conductive region, an electrode region, or an electrode layer. The covering layer 30 may include an electrode, such as a top-electrode, the electrode including titanium nitride, tantalum nitride, tungsten nitride, niobium nitride, carbon, iridium, and/or ruthenium, or mixtures of the aforementioned components. A thickness of the electrode may be in a range of 2 to 20 nm.

The dielectric layer 10 may include a transition metal oxide, zirconium, zirconium oxide, hafnium, hafnium oxide, lead zirconium titanate, tantalum oxide, silicon nitride and/or barium strontium titanate. Furthermore, the dielectric layer 10 may include a dopant, which may include silicon, aluminium, lanthanum, yttrium, erbium, a rare earth element, calcium, magnesium, and/or strontium. The substrate 20 may include a further electrode, such as a bottom electrode, which may include titanium nitride, tantalum nitride, tungsten nitride, niobium nitride, carbon, iridium, silicon, and/or ruthenium. A thickness of the electrode may be in a range of 2 nm to 20 nm.

The dielectric layer 10 may include a region or a domain which is in a tetragonal, in an orthorhombic, or in a cubic crystalline state. Furthermore, the entire dielectric layer 10 may be in a tetragonal, in an orthorhombic, or in a cubic crystalline state. In the case of a tetragonal crystal, two lattice constants a and b, being parallel to a first and to a second crystal direction, are equal, whereas the third lattice constant c, being parallel to a third crystal direction differs from a and b, hence $a=b\neq c$. In the case of an orthorhombic crystal, the three lattice constants a, b, and c, being parallel to the three crystal directions, differ from each other, hence $a\neq b\neq c$. In the case of a cubic crystal, the three lattice constants a, b, and c, being parallel to the three crystal directions, are equal, hence $a=b=c$. The crystal orientation may be defined relative to interfaces of the dielectric layer 10 to a substrate, to an electrode, or to a covering layer, such as the substrate 20, or the covering layer 13, respectively. Such interfaces may be comprised by the regions 101, 102. Crystalline states and respective crystal orientations are described in conjunction with FIGS. 3A, 3B, and 4.

The dielectric layer 10 may furthermore be stressed or may include a region or a domain which is stressed. A stressed dielectric layer 10 or a region or a domain thereof may be a compressed, strained, stretched, or expanded layer, region, or domain. Such stress may be stabilize a respective crystalline state, which would be absent without the stress at given composition, temperature, and or pressure.

The covering layer 30 may influence and/or allow a transition of a structural state of the dielectric layer 10, for example, a transition from an amorphous state to a crystalline state, from an amorphous state to a tetragonal crystalline state, from an amorphous state to a cubic state, from an amorphous state to an orthorhombic state, from a non-tetragonal crystalline state to a tetragonal crystalline state, from a non-cubic state to a cubic state, from a non-orthorhombic state to an orthorhombic state, from a tetragonal, orthorhombic, or cubic state to a non monoclinic lower symmetry state, and/or from a monoclinic crystalline state to a tetragonal crystalline state.

Figure 1B:
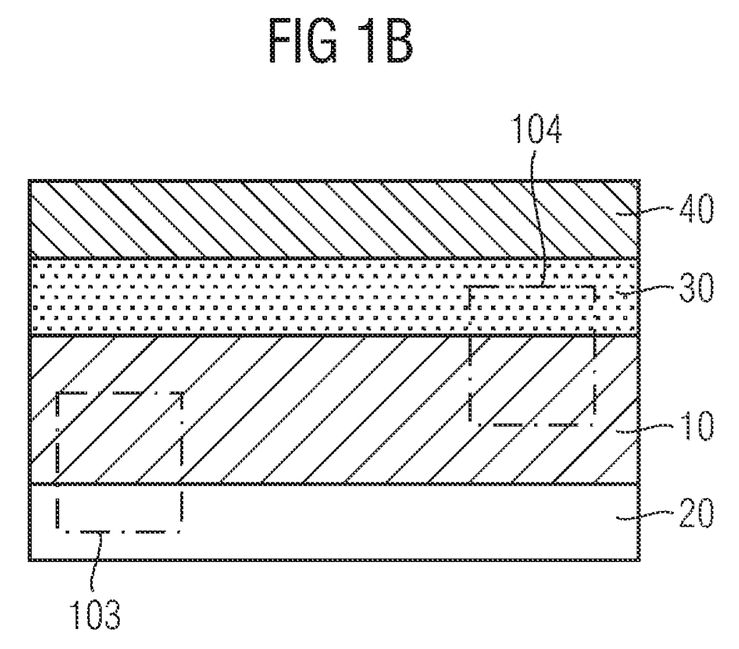

FIG. 1B illustrates a schematic view of an arrangement with a dielectric layer according to one embodiment, having the dielectric layer 10, the substrate 20, and the covering layer 30, as they have been described in conjunction with FIG. 1A.

According to this embodiment, there is arranged a stress inducing layer 40 on the covering layer 30. The stress inducing layer 40 may influence, allow, and/or support the covering layer 30 in influencing and/or in allowing a transition of a structural state of the dielectric layer 10.

Furthermore, the stress inducing layer 40 may be removed after the dielectric layer 10, a region of the dielectric layer 10, and/or a domain of the dielectric layer 10 has been rendered into one of the aforementioned crystalline states. Also, the stress inducing layer 40 may remain on the covering layer 30 and may also remain with an integrated circuit, this may additionally serve other purposes, such as conducting a current, applying a voltage, sinking heat, barring the diffusion of dopants, and/or sealing underlying entities from an environment.

Figure 2A:
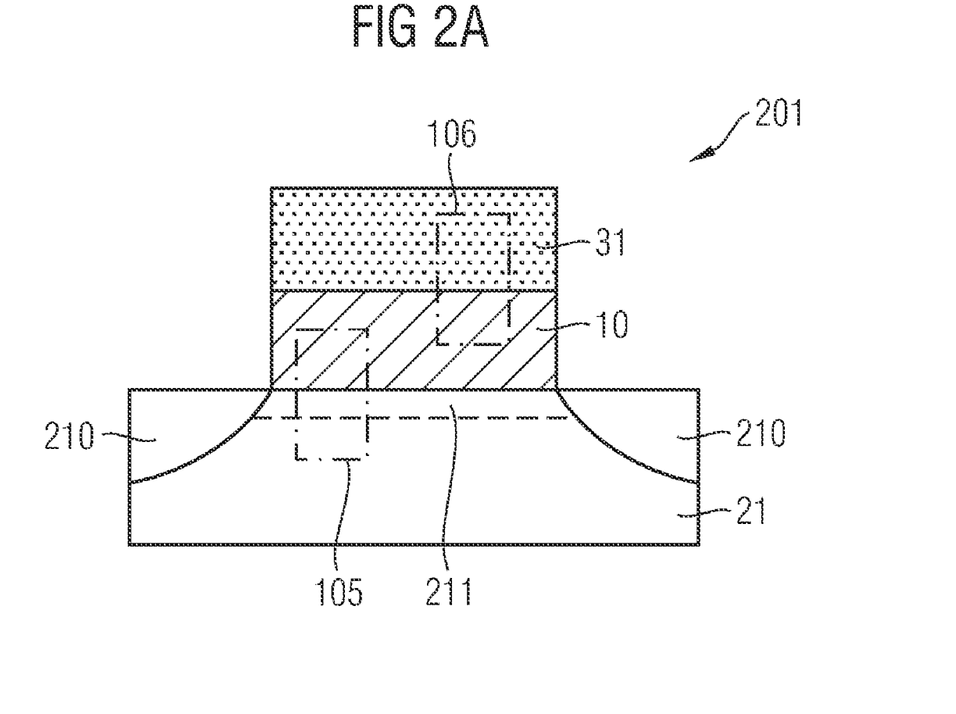
FIGS. 2A through 2C illustrate schematic views of electronic entities having a dielectric layer according to embodiments.

FIG. 2A illustrates a transistor having a dielectric layer, according to one embodiment. A transistor 201 is arranged on and in a substrate 21. The substrate 21 comprises doped regions 210, such as source and or drain-regions. In the substrate 21 and between the doped regions 210 there is arranged a transistor channel 211. The dielectric layer 10 is arranged on a surface of the substrate 21 and separates an electrode 31, such as a gate electrode, from the transistor channel 211. The conductivity of the transistor channel 211 may be enhanced and/or depleted by applying a voltage at the electrode 31.

The dielectric layer 10 having one of the aforementioned crystalline structures or having a region or a domain in such a crystalline state may provide an enhanced dielectric constant, hence allowing for an optimized tuning of the transistor channel 211. As far as the tetragonal crystalline state and the crystal orientation are concerned, it is referred to the description in conjunction with FIGS. 3A, 3B, and 4.

The transistor entity 201 may be a selection transistor of a memory device, such as a dynamic random access memory (DRAM). Furthermore, the transistor entity 201 may be a transistor of a logic circuitry, a microprocessor, or a transistor of a logic entity of a memory device.

Figure 2B:
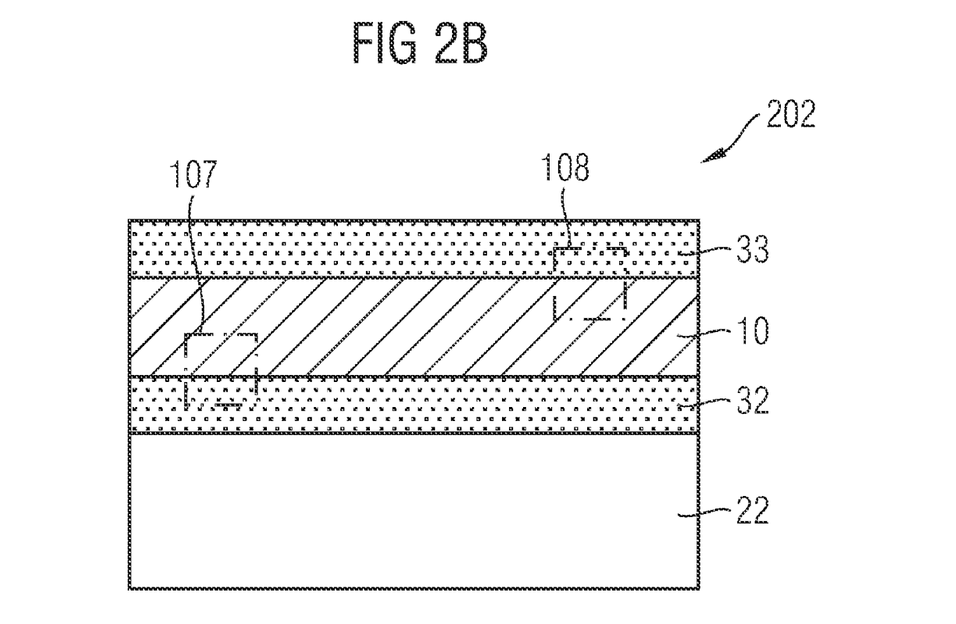

FIG. 2B illustrates a schematic view of a capacitor having a dielectric layer according to one embodiment. A capacitor 202 is arranged on, in, and/or in the vicinity of a substrate 22. The dielectric layer 10 is arranged between a first electrode 32 and a second electrode 33. The first electrode 32 may be a bottom electrode, whereas, the second electrode 33 may be a top electrode. The dielectric layer 10—or the dielectric layer 10 having a region or a domain—in one of the aforementioned crystalline states, may provide an enhanced dielectric constant, increasing the capacity of the capacitor 202, while still allowing for a miniaturization of the electrode areas of the first electrode 32 and/or the second electrode 33. The dielectric layer 10 may be part of any type of capacitor, such capacitors including integrated capacitors, such as trench, stack, or planar capacitors, and discrete capacitors, such as discrete capacitor components.

Figure 2C:
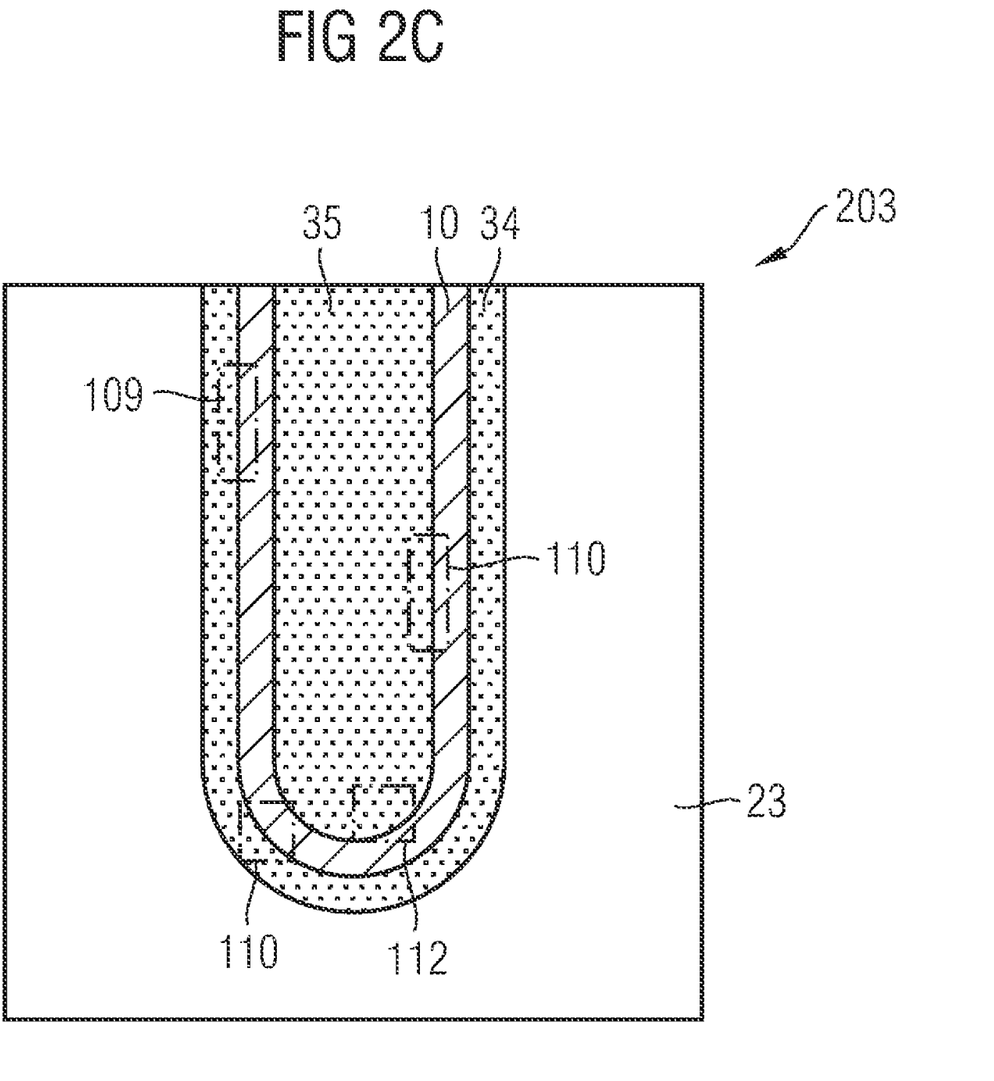

FIG. 2C illustrates a trench capacitor having a dielectric layer according to one embodiment. The trench capacitor 203 may be arranged in a substrate 23. The dielectric layer 10 is arranged between a first trench capacitor electrode 34 and a second trench capacitor electrode 35. The first trench capacitor electrode 35 may include a conductive layer on a sidewall on the trench in the substrate 23 or may include a doped or a conductive region of the substrate 23 in the vicinity of the trench. The dielectric layer 10, according to this embodiment, may be arranged conformally according to the topography of the trench. The second electrode 35 may fill the remainder of the trench, or cover, at least partially, the dielectric layer 10. The dielectric layer 10 may include a region and/or a domain in one of the aforementioned crystalline states.

Figure 3A:
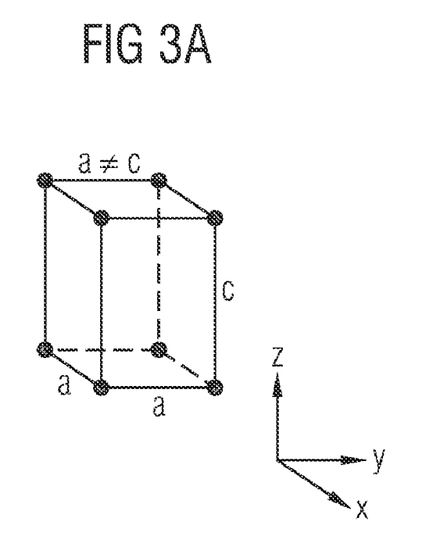
FIG. 3A through 3C illustrate schematic views of crystal structures.

FIG. 3A illustrates a schematic view of an elementary cell of the tetragonal crystalline structure. Here, as an example, a first lattice constant is orientated parallel to an x-axis, a second lattice constant is orientated parallel to a y-axis, and a third lattice constant is orientated parallel to a z-axis. In a tetragonal crystal structure, the first and the second lattice constants are of equal length, which may be denoted as a. The length of the third axis, denoted as c, in general, differs from a, hence a≠c. More specifically, a tetragonal crystal structure may be one in which c is greater than a, hence c>a. A tetragonality t may further be defined as a ratio of the length c divided by the length a, i.e.

$$t = c/a. \quad (1)$$

In general, a tetragonal crystalline state is characterized in that the tetragonality t according to Eq. (1) differs from unity. With t=1 all lattice constants become equal representing the cubic crystalline structure. Hence, the case of a cubic crystalline state may be represented by a tetragonality t that equals unity.

Figure 3B:
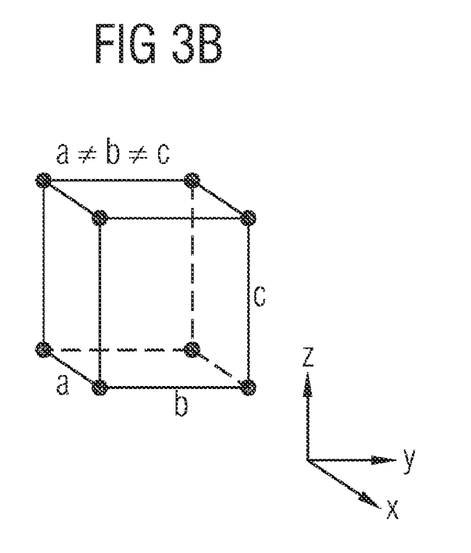

FIG. 3B illustrates a schematic view of an elementary cell of the orthorhombic crystalline structure. Here, as an example, a first lattice constant is orientated parallel to an x-axis, a second lattice constant is orientated parallel to a y-axis, and a third lattice constant is orientated parallel to a z-axis. In an orthorhombic crystal structure, all lattice constants are of different length. Denoting the first lattice constant as a, the second lattice constant as b, and the third lattice constant as c, one may characterize the orthorhombic crystalline structure with a≠b≠c. Even for the case of an orthorhombic crystalline structure a tetragonality t may be defined as the ratio of the length c divided by the length a, following Eq. (1).

Figure 3C:
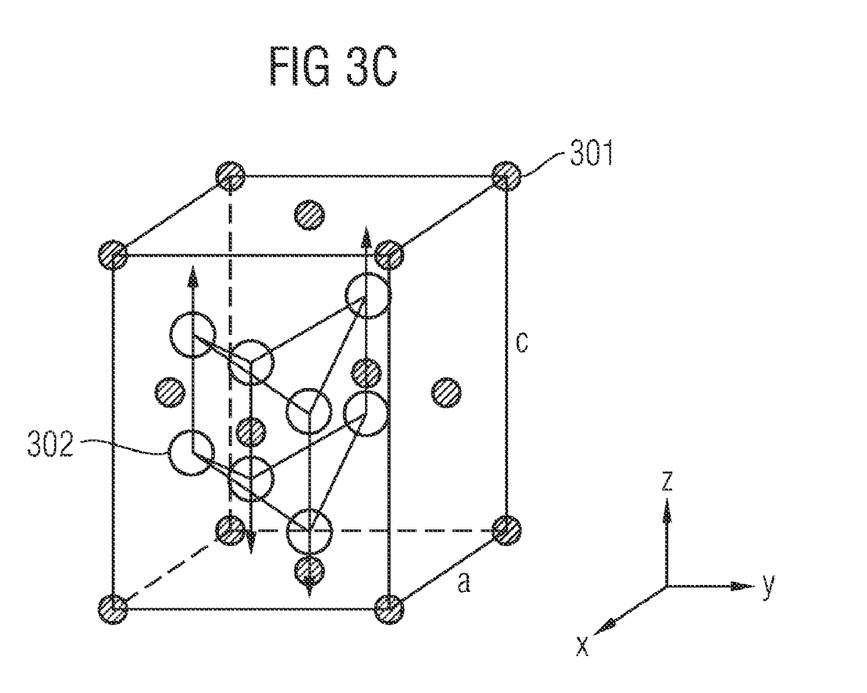

FIG. 3C illustrate a schematic view of a compound material in a tetragonal crystalline state. The compound material comprises a first compound 301, and a second compound 302. The first compound 301 and the second compound 302 may be one of the group of a transition metal, zirconium, hafnium, tantalum, barium, strontium, silicon, aluminium, lanthanum, yttrium, erbium, calcium, magnesium, a rare earth element, nitrogen and/or oxygen. An example for a compound material may include hafnium oxide, a transition metal oxide, zirconium oxide and/or tantalum oxide. Furthermore, the compound material may include a dopant, such as silicon, aluminium, lanthanum, yttrium, erbium, magnesium, a rare earth element, calcium, and/or strontium. The first compound may include a transition metal, hafnium, zirconium, tantalum, barium, strontium and/or titanium whereas the second compound 302 may include oxygen and/or nitrogen. For example, the compound including zirconium oxide, the first compound 301 may include zirconium, whereas the second compound 302 may include oxygen. As a further example, the compound including hafnium oxide, the first compound 301 may include hafnium, whereas the second compound 302 may include oxygen. According to an embodiment of the present the invention, the tetragonality t may be greater than 1 and less than 1.1, greater than or equal to 1, and less than 1.04, or greater than or equal to 1, and less than 1.025. The tetragonality t assuming unity representing the case of a cubic crystalline structure.

Figure 4:
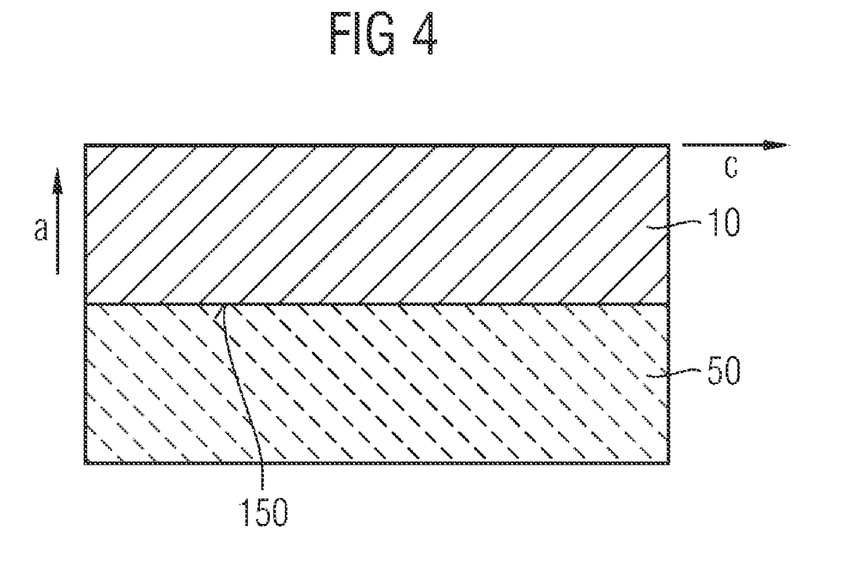
FIG. 4 illustrates a schematic view of a crystal orientation of a dielectric layer according to one embodiment.

FIG. 4 illustrates a schematic view of an arrangement including the dielectric layer 10, according to one embodiment. According to this embodiment, the dielectric layer 10 includes at least a region and/or a domain in one of the aforementioned crystalline states. Such a region and/or domain may be comprised by one of the regions 101, 102, 103, 104, 105, 106, 107, 108, 109, 110, 111, 112, as they are illustrated in FIG. 1A, 1B, 2A, 2B, or 2C, respectively.

An interface 150 of the dielectric layer 10 to an adjacent entity 50, such as the substrate 20 of FIG. 1A or 1B, the covering layer 30 of FIG. 1A or 1B, the substrate 21 or the electrode 31 of FIG. 2A, the first electrode 32 or the second electrode 33 of FIG. 2B, or the electrode 34 or the electrode 35 of FIG. 2C, may be defined as illustrated in FIG. 4.

According to embodiments, the dielectric layer 10, or a region or a domain thereof, may be arranged such that the third lattice constant, denoted here as c, or including a direction written as a vector c, is parallel to the plane of the interface 150. At least one of the remaining lattice constants, namely the first lattice constant or the second lattice constant, having the magnitude a, may then be arranged such that it is perpendicular to the plane of the interface 150. The first and second lattice constant may nevertheless be arranged in any way but satisfying the condition that the third lattice axis is arranged parallel to the plane of the interface 150. The first and the second lattice constants may be arranged such that they are both perpendicular to the third lattice constant.

In the case of the capacitor 203, as has been described in conjunction with FIG. 2C, the dielectric layer 10 may include more than one region and/or domain, to satisfy, at least in part, the condition that the third lattice constant is arranged parallel to the plane of a local interface between the dielectric layer 10 and one of the electrodes 34 and 35. Furthermore, the dielectric layer 10 may include more than one crystalline domain, such to allow for satisfying the condition of the lattice constant c being arranged parallel to an interface between the dielectric layer 10 and a trench capacitor electrode to a maximum extent. The topography of the dielectric layer 10, the first electrode 34, and the second electrode 35 may therefore include planar regions or regions which are arranged accordingly.

Furthermore, according to one embodiment, the tetragonality t of the dielectric layer 10, or a region or a domain thereof, may be equal to or greater than 1, and less than 1.1, equal to or greater than 1, and less than 1.04, or equal to or greater than 1, and less than 1.025.

Figure 5A:
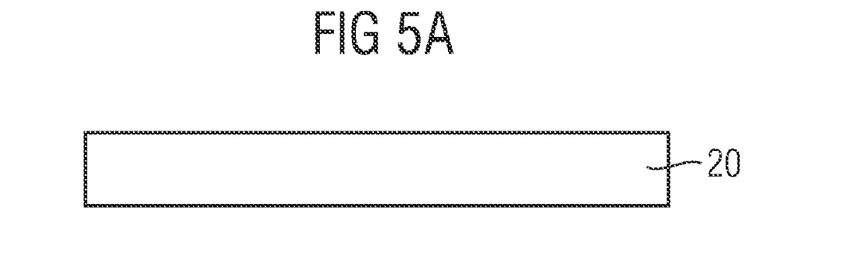
FIGS. 5A through 5D illustrate schematic views of a dielectric layer in various stages during manufacturing according to one embodiment.

FIGS. 5A through 5D illustrate schematic views of a dielectric layer in various stages during manufacturing, according to one embodiment. As illustrated in FIG. 5A, a substrate 20 is provided. The substrate 20 may include a semiconductor substrate, which, in turn, may include electronic and/or optic entities. The entities include transistor elements, capacitor elements, resistor elements, diode elements, light emitting elements, semiconductor laser elements, light sensor elements, and/or other electronic or optic entities as they are known from the technology of integrated device manufacturing. Furthermore, the substrate 20 may include a conductive region or an electrode. Such a conductive region or such an electrode may include titanium nitride, tantalum nitride, tungsten nitride, niobium nitride, carbon, iridium, and/or ruthenium. A thickness of the region or electrode may be in a range of 2 to 20 nm. A dielectric layer, for example the dielectric layer as described in the following, may be provided on such a conductive region and/or electrode.

Figure 5B:
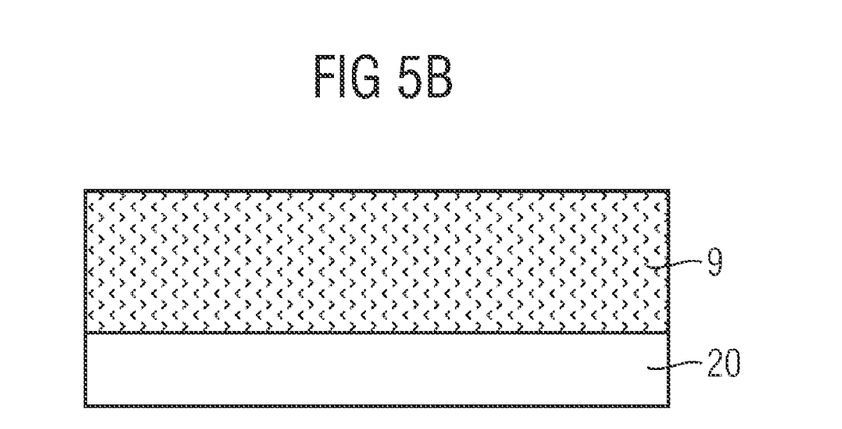

In another process, as illustrated in FIG. 5B, a preliminary dielectric layer 9 is provided on the substrate 20. The preliminary dielectric layer 9 may be provided an atomic layer deposition (ALD), a metal organic atomic layer deposition (MOALD), a chemical vapor deposition (CVD), a metal organic chemical vapor deposition (MOCVD), or one of a related process. The preliminary dielectric layer 9 may include a transition metal, a transition metal oxide, zirconium, zirconium oxide, hafnium, hafnium oxide, lead zirconium oxide, titanium oxide, silicon nitride, barium strontium titanate, oxygen, and/or nitrogen. Furthermore, the preliminary dielectric layer 9 may include at least one dopant, which may be selected from the group of silicon, aluminium, lanthanum, yttrium, erbium, calcium, magnesium, strontium and/or a rare earth element. The preliminary dielectric layer 9 may include hafnium-silicon-oxide, i.e. $Hf_{(1-x)}Si_xO_2$. Furthermore, a layer thickness of the preliminary dielectric layer 9 may be in a range of 2 to 200 nm, in a range of 2 to 50 nm, or below 20 nm. However, the invention applies to a layer thickness which is outside of the ranges as well.

The preliminary dielectric layer 9 may have a crystallization temperature, at and above which the dielectric layer 9 undergoes a transition from an amorphous state to a crystalline state, from an amorphous state to a tetragonal crystalline state, from an amorphous state to a cubic state, from an amorphous state to an orthorhombic state, from a non-tetragonal crystalline state to a tetragonal crystalline state, from a non-cubic state to a cubic state, from a non-orthorhombic state to an orthorhombic state, from a tetragonal, orthorhombic, or cubic state to a non monoclinic lower symmetry state, and/or from a monoclinic crystalline state to a tetragonal crystalline state.

Initially, the preliminary dielectric layer 9 may be provided in an amorphous state. The crystallization temperature may be above 350° C., 500° C., 750° C. or above 1000° C. The provision of the preliminary layer 9 may include a doping of the preliminary dielectric layer 9 with a dopant. The doping may be conducted in a separate process, for example, by an implantation, a diffusion, or an activation stage. Furthermore, the dopant may be provided in-situ, together with the remaining components of the dielectric layer. This may be effected by an atomic layer deposition (ALD, MOALD) process or a chemical vapour deposition process (CVD, MOCVD) using the appropriate precursors. The precursors may include a transition metal, a transition metal oxide, zirconium, hafnium, hafnium, lead, titanium, silicon, barium, strontium, oxygen, nitrogen, aluminium, lanthanum, yttrium, erbium, calcium, magnesium, and/or a rare earth element.

Figure 5C:
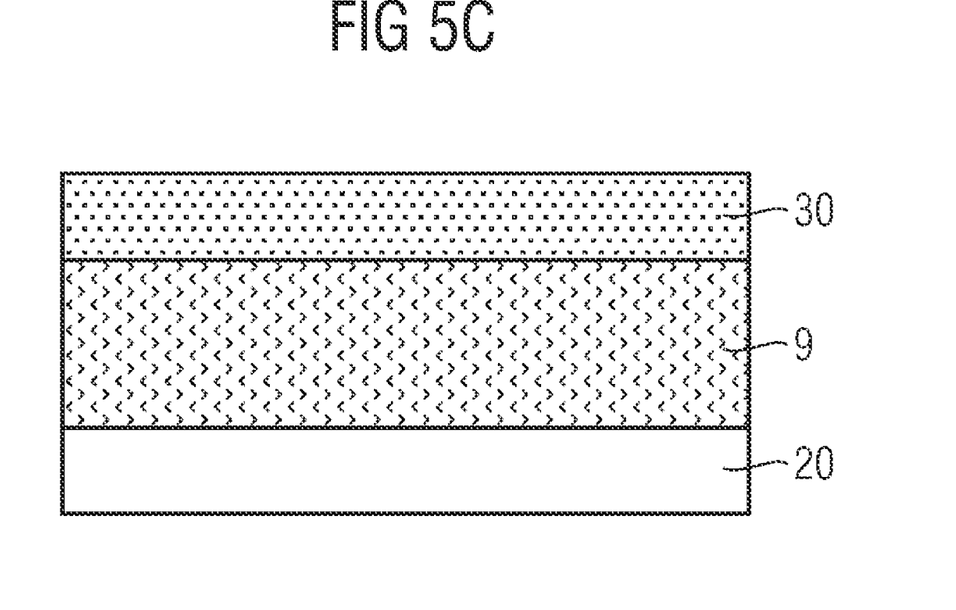

In another process, as illustrated in FIG. 5C, the covering layer 30 is provided on the preliminary dielectric layer 9. The covering layer 30 may include a conductive region, a conductive material, and/or an electrode. The covering layer 30 may further include titanium nitride, tantalum nitride, tungsten nitride, niobium nitride, carbon, iridium, and/or ruthenium. A thickness of the region or electrode may be in a range of 2 to 20 nm. The covering layer 30 may be provided at a first temperature, the first temperature being below the crystallization temperature of the preliminary dielectric layer 9. This first temperature may be below 1000° C., below 750° C., below 500° C., or below 350° C. According to an embodiment, the first temperature may be equal or close to the crystallization temperature of the dielectric layer, which may induce a crystallization during the providing or deposition of the covering layer, the covering layer being for example an electrode. The first temperature may, in such a case, 10 K below the crystallization temperature, 1 K below the crystallization temperature, or 0.1 K below the crystallization temperature.

Figure 5D:
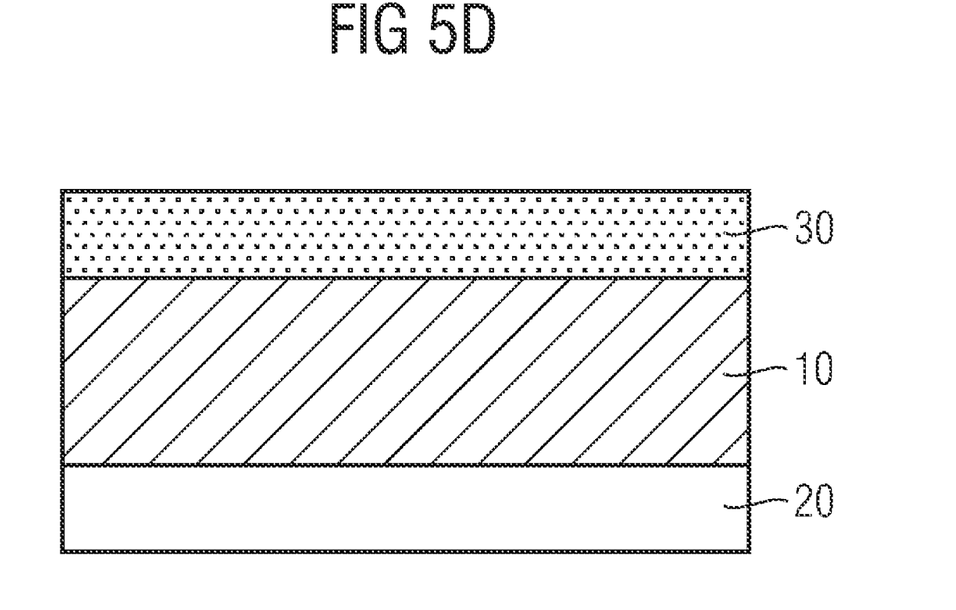

In another process, as illustrated in FIG. 5D, the arrangement of the dielectric layer 10 and the covering layer 30 is heated to a second temperature, the second temperature being equal to or greater than the crystallization temperature. In this way, the preliminary dielectric layer 9 is transferred into the dielectric layer 10, which includes the region or the domain in any of the aforementioned crystalline states. The heating may be effected as an anneal-stage, in which electronic and/or optic entities, which may have already been realized in or on the substrate 20, may be activated or functionalized. Furthermore, this anneal-stage may include a standard anneal-stage of a CMOS manufacturing process.

The crystal orientation of the dielectric layer 10 and/or a region or a domain thereof may be such that the third lattice constant c is arranged parallel to a plane of an interface between the dielectric layer 10 and the substrate 20 and/or an interface between the dielectric layer 10 and the covering layer 30. The tetragonality t, as defined by Eq. (1), of the dielectric layer 10 or a region or a domain thereof may be equal to or greater than 1 and less than 1.1, equal to or greater than 1 and less than 1.04, or equal to or greater than 1 and less than 1.025. The tetragonality t may be determined by a content of the dopant, which may be in a range between 0.5% to 20%. For example, a hafnium oxide or a zirconium oxide layer may include 0.5% to 20% of silicon, and may be provided such that it includes at least a region or a domain in a tetragonal crystalline state.

The dielectric constant of the dielectric layer 10 may further be a function of the content of the dopant of the dielectric layer 10. Selecting the composition of the dielectric layer 10 may further result in a desired orientation or crystallization. Furthermore, the dielectric constant may be a function of the crystalline state, and/or the tetragonality t. The crystalline state and the tetragonality t may be determined by selecting at least one appropriate dopant and a predetermined well-defined content.

Figure 6A:
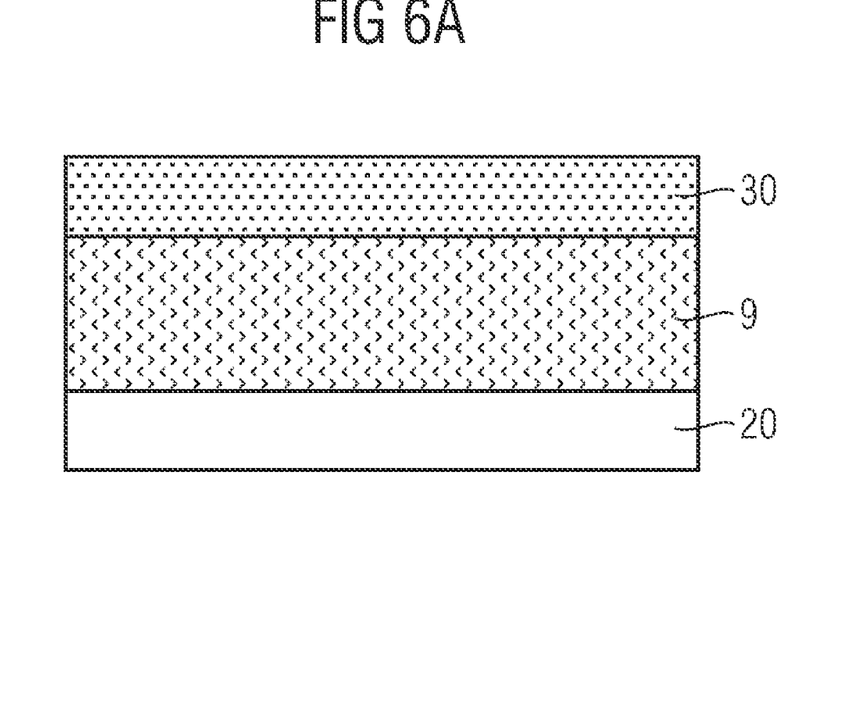
FIGS. 6A through 6D illustrate schematic views of a dielectric layer in various stages during manufacturing according to one embodiment.

FIGS. 6A through 6D illustrate schematic views of a dielectric layer in various stages during manufacturing, according to one embodiment. In FIG. 6A, the same arrangement of the substrate 20, the preliminary dielectric layer 9, and the covering layer 30 is illustrated as in FIG. 5C.

Figure 6B:
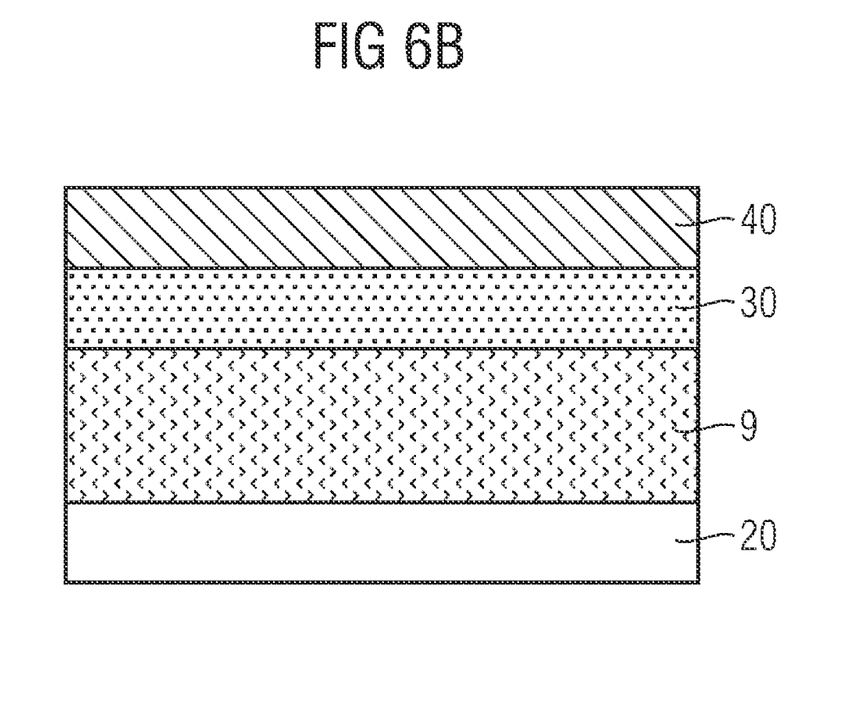

According to this embodiment, a stress inducing layer 40 is provided on the covering layer 30 and the preliminary dielectric layer 9, prior to a phase transition of the preliminary dielectric layer 9. A corresponding arrangement including such a stress inducing layer 40 is illustrated in FIG. 6B. The stress inducing layer 40 may influence, advantageously influence, allow, or support the covering layer 30 in influencing, in advantageously influencing, or allowing a transition of the state of the preliminary dielectric layer 9.

Figure 6C:
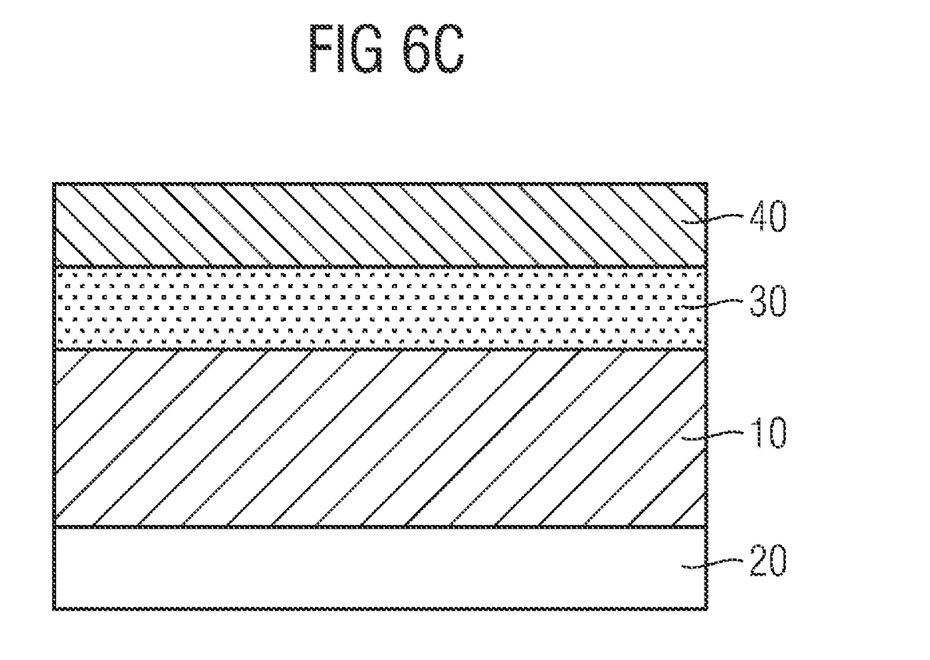

Such transition may be conducted or induced in another process, the result being illustrated as in FIG. 6C. The transition may be induced by heating the preliminary dielectric layer 9 and the covering layer 30 to the second temperature, the second temperature being equal or greater than the crystallization temperature. In this way, the preliminary dielectric layer 9 is transferred into the dielectric layer 10, which comprises the region or the domain in any of the aforementioned crystalline states. The heating may be effected as an anneal-stage or may include a standard anneal-stage of a CMOS manufacturing process.

During such a transition stage and/or heating stage, the stress inducing layer 40 may mechanically confine or support the covering layer 30 in mechanically confining the preliminary dielectric layer 9 such that, during a phase transition at a well-defined process temperature, the preliminary dielectric layer 9 undergoes a phase transition to a desired crystalline state. Such a desired crystalline state may be any of the aforementioned crystalline states and may furthermore feature an enhanced dielectric constant or a ferroelectric state, which, in turn, provides an electric dipole. Such a desired crystalline state may otherwise, i.e. without the covering layer 30 and/or without the stress inducing layer 40, difficult or impossible to attain. A crystalline state may further include a desired orientation of the crystal lattice relative to an interface, an electrode, an electrode plane, or to an applied electric field.

Crystalline states which may not feature a considerable enhancement of the dielectric constant may include an amorphous or a monoclinic crystalline state, which may, as a result, be undesirable. It is noted, that the covering layer 30 may suffice for inducing a desired phase transition to a respective desired crystalline state, hence rendering the stress inducing layer 40 optional. A ready structure may also include the stress inducing layer 40. The stress inducing layer 40 in this case may serve other purposes, such as conducting a current, applying a voltage, sinking heat, barring the diffusion of dopants, and/or sealing underlying entities from an environment. In another process, as illustrated in FIG. 6D, the stress inducing layer 40 may nevertheless be removed.

Figure 6D:
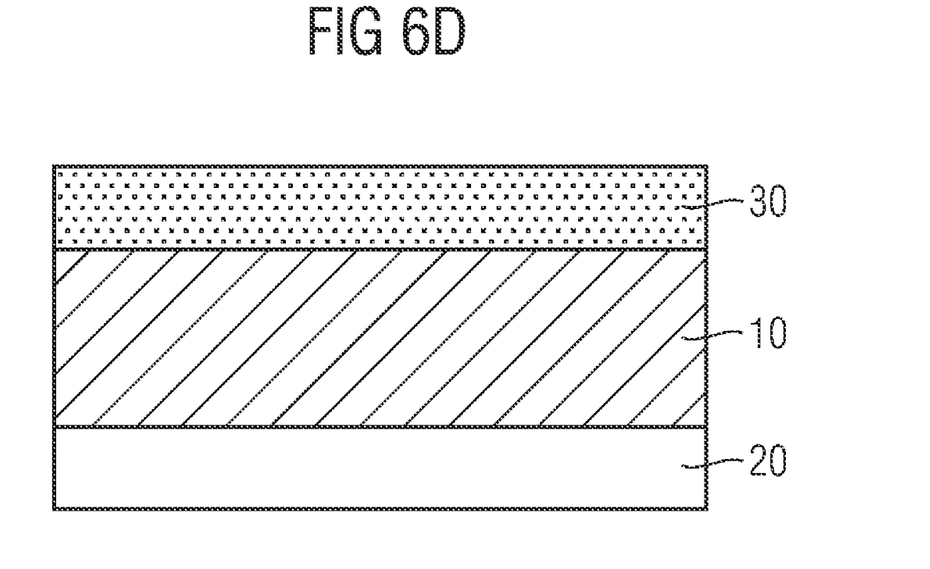

The structure as it is illustrated in FIG. 6C or FIG. 6D may now be subjected to further process stages or processes, those being part, for example, of a CMOS manufacturing process. Such further stages may be conducted in order to complete the respective integrated circuit.

According to one embodiment, a phase transition of a layer, a material, a compound material, or a section or a domain thereof is understood as a transition from a first state to a second state. The first state and the second state may include an amorphous state, a crystalline state, a tetragonal crystalline state, an orthorhombic crystalline state, a cubic crystalline state, a monoclinic crystalline state, or any combination thereof. The term crystalline is used in this context as to include mono-crystalline, poly-crystalline, or nano-crystalline. According to one embodiment, a phase transition is induced to reduce degradation, reduce twinning, reduce the formation of conductive grain boundaries, reduce the conductivity of grain boundaries, reduce leakage currents, and/or to increase the dielectric constant of a dielectric layer. Furthermore, according to one embodiment, a concentration of a dopant may be reduced while still attaining satisfying physical and dielectric properties.

According to one embodiment, the dielectric layer 10 may also include a region or a domain which is in a ferroelectric or anti-ferroelectric state. In such a case, the crystalline state may be another crystalline state as those which have been described in conjunction with the aforementioned embodiments. Such a state may also include an amorphous, a monoclinic crystalline, or another crystalline state. Furthermore, the entire dielectric layer 10 may be ferroelectric or anti-ferroelectric.

In this way, the dielectric layer 10 may provide an electric polarisation which may exploited in order to provide a memory entity. A state of information, such as the binary states "0" or "1", may be stored in the dielectric layer 10 by using assuming two distinguishable ferroelectric states, such as a ferroelectric state and an anti-ferroelectric state. Electric polarisation levels in between the level of a saturated ferroelectric state and a saturated anti-ferroelectric state may provide a storage of several information units, such as, for example, a two-bit or a three-bit memory cell. The latter may also be referred to as a multi-bit storage cell. Since the dielectric properties of the dielectric layer 10 according such an embodiment may be of secondary interest, such a dielectric layer may also be referred to as an oxide layer.

The orientation of the electric polarisation of such a dielectric or oxide layer 10 in a ferroelectric state may be defined relative to interfaces to a substrate, to an electrode, or to a covering layer, such as the substrate 20, or the covering layer 13, respectively. An anti-ferroelectric state may be characterized in that the layer comprises domains and/or sub-domains polarised with an opposite orientation such that to cancel out neighbouring dipole moments and, hence, having a vanishing overall polarisation.

Figure 7A:
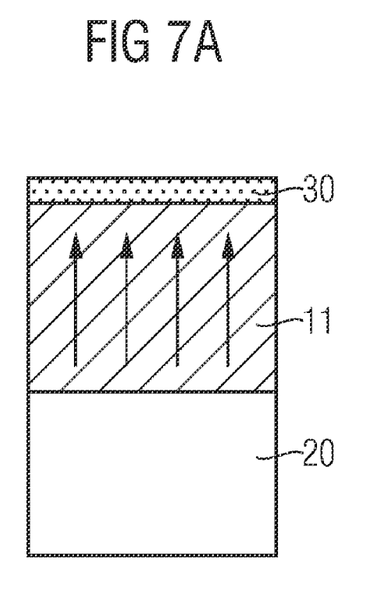
FIGS. 7A through 7C illustrate schematic views of an oxide layer in various ferroelectric states according to one embodiment.
Figure 7B:
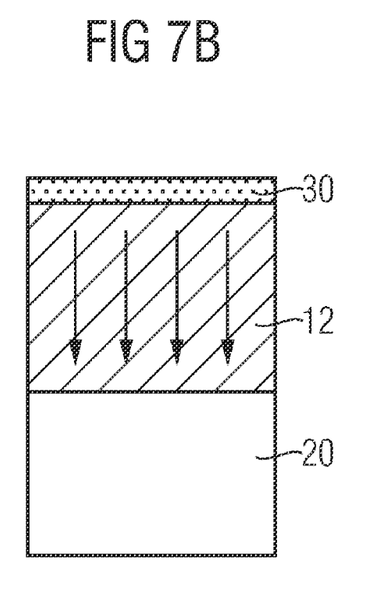
Figure 7C:
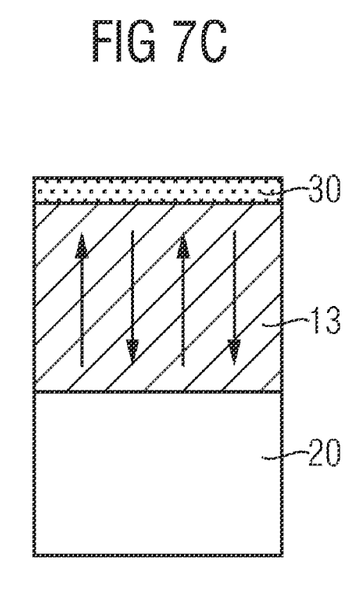

FIGS. 7A through 7C illustrate schematic views of oxide layers in various ferroelectric states according to one embodiment. As illustrated in FIG. 7A, there is an oxide layer 11 arranged on the substrate 20. On the oxide layer 11 there is arranged the covering layer 30. The oxide layer 11 is in a ferroelectric state such that the dipole moment within the oxide layer 11 is oriented perpendicular to an interface of the oxide layer 11 and the substrate 20 or to an interface between the oxide layer 11 and the covering layer 30. Furthermore, the orientation of the dipole moment is such that the moment is oriented away from the substrate 20.

It is to be noted here, that the above detailed description of the dielectric layer may as well apply to an oxide layer according to one embodiment, such as the oxide layers 11, 12, 13, and 14. Specifically, the methods of manufacturing of a dielectric layer, various arrangements of a dielectric layer, crystalline states and orientations of a dielectric layer, and components of a dielectric layer as described in conjunction with FIGS. 1A, 1B, 2A through 2C, 3A through 3C, 4, 5A through 5D, and 6A through 6D may as well apply to the oxide layer 11, 12, 13, and 14.

As illustrated in FIG. 7B, there is an oxide layer 12 arranged on the substrate 20. Compared to the oxide layer 11 as illustrated in FIG. 7A, the orientation of the electric dipole of the oxide layer 12 is anti-parallel to the orientation of the electric dipole of the oxide layer 11. Physically, the oxide layers 11, 12, and 13 may be an identical layer, only distinguished by the orientation of the electric dipole, which, in turn, may be switched and altered. Such a switching may be effected, for example, by an application of a voltage, between the substrate 20 or a conductive entity thereof, such as an electrode, and the covering layer 30. Such a voltage may be in a range of 0.5 volts to 5 volts, or approximately 1.5 volts or 3 volts. Further layers and their effective oxide thickness (EOT) may be to be considered in order to determine a respective threshold value for a suitable switching voltage. In addition to this, two ferroelectric states, such as the one of the oxide layer 11 and the one of the oxide layer 12, may be distinguished by a shift in a threshold voltage. Such a shift may be in a range of 50 mV to 1.5 volt, or approximately 300 mV. A thickness of one of the oxide layers 11, 12, 13, 14 may be in a range of 3 nm to 20 nm, or approximately 10 nm.

As illustrated in FIG. 7C, an oxide layer 13 is arranged between the substrate 20 and the covering layer 30. The dipole moments of the oxide layer 13 are arranged such that neighbouring moments are oriented opposite to each other. In this way, neighbouring dipole moments cancel out each other and the overall polarisation of the oxide layer 13 basically vanishes. Such a state may be referred to as an anti-ferroelectric state of the oxide layer 13. Although an anti-ferroelectric material, such as the material of the oxide layer 13, may not provide a notable dipole moment to its environment, an anti-ferroelectric material may be still distinguished from a non-ferroelectric material, since an anti-ferroelectric material still possesses a dipole moment on a microscopic, crystallite or domain scale. Furthermore, an anti-ferroelectric material may provide no dipole moment to an environment, but because being still ferroelectric, may be switched to a ferroelectric state, for example to such states as the states of the oxide layer 11 and/or the oxide layer 12. In this way, an oxide layer according to one embodiment may provide a switchable dipole moment by using reorientation of the microscopic dipole orientations.

It is to be noted that an oxide layer in a ferroelectric state, such as the oxide layer 11 or the oxide layer 12, may be simultaneously in an amorphous state, whereas a ferroelectric layer in an anti-ferroelectric state, such as the oxide layer 13 may be simultaneously in a cubic crystalline state.

Figure 8:
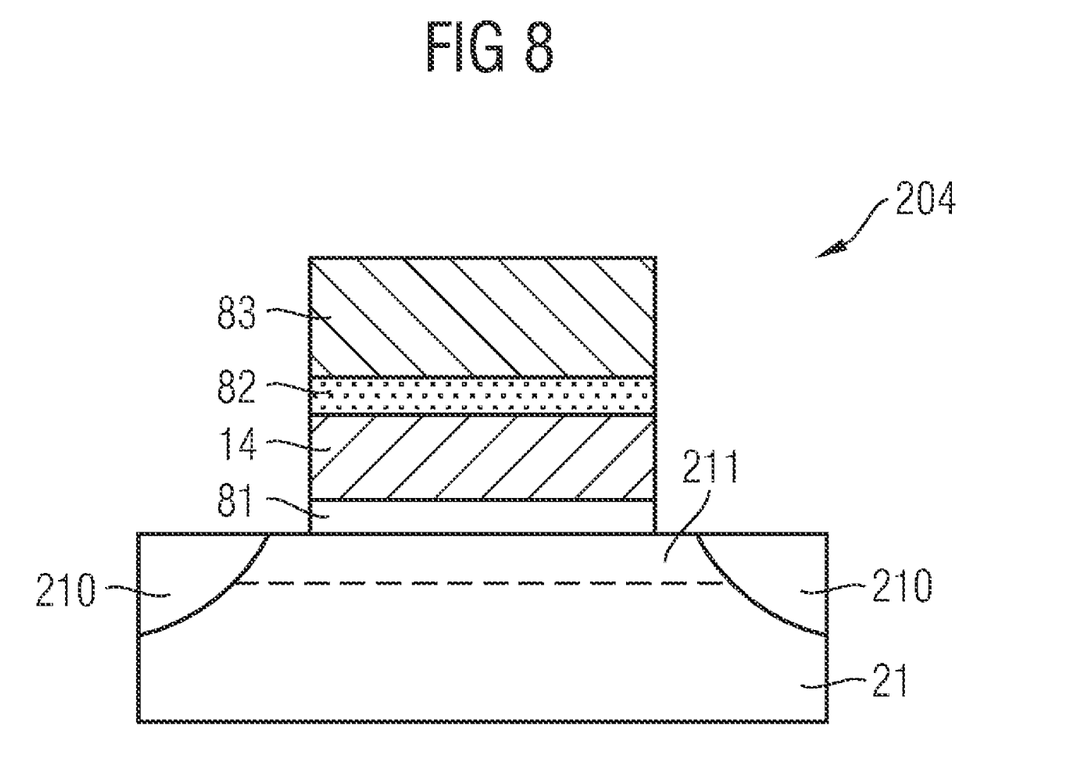
FIG. 8 illustrates a schematic view of a transistor and an oxide layer according to one embodiment.

FIG. 8 illustrates a transistor with an oxide layer according to one embodiment. A transistor 204 is arranged on the substrate 21. The substrate 21 comprises doped regions 210 and a transistor channel 211, as they have already been described in conjunction with FIG. 2A. A first intermediate layer 81 is arranged on the substrate 21. On the first intermediate layer 81 there is arranged an oxide layer 14, on which, in turn, a second intermediate layer 82 is arranged. On the second intermediate layer 82 there is arranged a top layer 83.

The first intermediate layer 81 may include a buffer layer, and/or an insulating layer, including, for example, silicon and/or one of the common insulating materials as they are known from the manufacturing of highly integrated devices. The second intermediate layer 82 may include a metal gate, and, hence, may include a conductive material, such as titanium nitride, tantalum nitride, a midgap material, or a related conductive material.

The oxide layer 14 may include a domain in a ferroelectric states or may be, as a hole, in a ferroelectric state. According to one embodiment, the oxide layer 14 may include an oxide layer, such as the oxide layers 11, 12, 13, as they have been described in conjunction with FIGS. 7A through 7C. Furthermore, the oxide layer 14 may be switched between different ferroelectric states, for example, between a ferroelectric state and an anti-ferroelectric state. In this way, the oxide material 14 may exhibit different dipole moments and may, hence, affect the conductivity of the transistor channel 211. In this way, a stable and a permanent dipole of the oxide layer 14 may determine the conductivity of the channel 211 and may hence provide a storage of an information state. Such an information state may be determined by measuring a current and/or a voltage across or through the transistor channel 211. As alternatives, a three-dimensional device or a conventional Fe-RAM capacitor may include an oxide layer according to one embodiment, such as the oxide layer 14.

The thickness of the intermediate layer 81 may be in a range between 0.1 and 5 nanometres. The intermediate layer 81 may include an insulating material, such as silica. The thickness of the oxide layer 14 may be in a range between 5 to 20 nanometres. The oxide layer 14 may include, for example, hafnium-oxide, doped hafnium oxide, hafnium-silicon-oxide (HfSiO), hafnium-titanium-silicon-oxide Hf(Si,Ti)O, a rare earth element doped hafnium-silicon-oxide. Zirconium-silicon-oxide, a hafnium oxide including a rare earth element, zirconium-oxide including a rare earth element, or any from the aforementioned possible materials of the dielectric layer 10.

According to one embodiment, two distinguishable ferroelectric states, such as a first ferroelectric state and a second electric state or a ferroelectric state and an anti-ferroelectric state, may be imposed onto the oxide layer 14 in order to provide a memory entity or unit. The switching may be effected by applying a voltage pulse to the second intermediate layer 82, which, in this case, may act as a gate electrode. The amplitude of such a voltage pulse may be in a range of 0.5 volts to 5 volts, or approximately 1.5 volts or 3 volts. The resulting ferroelectric dipole of the dielectric layer 14 may provide a voltage shift, which, in turn, may affect the transistor channel 211 or a conductivity of the transistor channel 211. Such a voltage shift may be in a range of 50 mV to 1.5 volt, or approximately 300 mV. The first intermediate layer 81 may furthermore include alternative materials, such as a chemical oxide, a film oxide, RTNO, and/or ISSG.

A remnant polarization of the oxide layer 14 in a ferroelectric state may be in a range up to 10 $\mu C/cm^2$ and the dielectric constant of the oxide layer 14 may be in a range of 20 to 35. The switching voltage may be approximately 3.0 volt and the silicon content may be in a range of 0.5 to 10 percent. Furthermore, the oxide layer 14 may exhibit a polarization and may be in a ferroelectric state at an edge of an orthorhombic region, the orthorhombic region may be characterized in that the dielectric layer 14 is in an orthorhombic state, and the edge of the orthorhombic region may be characterized in that the oxide layer 14 is still in an amorphous state or in a crystalline state which is different from an orthorhombic crystalline state, or has just undergone a phase transition to a crystalline state, such as an orthorhombic crystalline state. Furthermore, the edge of the orthorhombic region may be characterized in that the oxide layer 14 is still in an orthorhombic state or has just undergone a phase transition from an orthorhombic crystalline state to another crystalline state, such as any of the aforementioned crystalline states. A tetragonality t being close to unity may indicate the proximity to the orthorhombic state, such a tetragonality, for example, being equal to or greater than 1 and less than 1.1, or equal to or greater than 1 and less than 1.04.

According to another embodiment, a silica layer ($SiO_2$) is grown on a substrate with a thickness of 0.2 nm to 3 nm. The silica may be grown by using a chemical oxide or a thermal oxide, such as RTNO or ISSG. The silica layer may be or may be part of the first intermediate layer 81. On the silica layer, an hafnium-silicon-oxide layer is deposited. Instead of hafnium-silicon-oxide any of the aforementioned materials of the oxide layers 11, 12, 13, or 14 may apply as well. The hafnium-silicon-oxide layer may be or may be part of the any of the oxide layers 11, 12, 13, and 14. A low temperature anneal may be conducted by using a plasma nitridation and/or a nitrogen/ammonia anneal at temperatures below 900° C. On the hafnium-silicon-oxide layer, a metal electrode deposition may be conducted, including, for example, a deposition of tantalum-nitride, Titanium-nitride, tantalum-carbon-nitride (TaCN), or niobium-carbon-nitride (NbCN). The metal electrode may be or may be part of the second intermediate layer 82 and/or the a top layer 83. A high temperature anneal may be now conducted in order to crystallize the hafnium-silicon-oxide layer or in order to induce a desired phase transition of the hafnium-silicon-oxide layer to any of the aforementioned crystalline states.

The preceding description only describes exemplary embodiments of the invention. The features disclosed therein and the claims and the drawings can, therefore, be essential for the realisation of the invention in its various embodiments, both individually and in any combination. While the foregoing is directed to the present invention, other and further embodiments of this invention may be devised without departing from the basic scope of the invention, the scope of the present invention being determined by the claims that follow.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating an integrated circuit device, the method comprising:

forming a dielectric layer on a semiconductor substrate, the dielectric layer being in an amorphous state and having a crystallization temperature, at and above which the dielectric layer undergoes a transition from the amorphous state to a crystalline state;

doping the dielectric layer with a dopant;

forming a covering layer on the dielectric layer at a first temperature, the first temperature being below the crystallization temperature, the covering layer comprising a conductive material; and heating the dielectric layer to a second temperature, the second temperature being equal to or greater than the crystallization temperature.

2. The method of claim 1, wherein after heating the dielectric layer, the dielectric layer comprises a domain of the dielectric layer in a crystalline state, wherein a first lattice constant of the crystalline state is perpendicular to an interface between the dielectric layer and the substrate and a second lattice constant of the crystalline state is parallel to the interface, and wherein a ratio of the second lattice constant divided by the first lattice constant is equal to or greater than 1, and less than 1.1.

3. The method of claim 2, wherein the ratio of the second lattice constant divided by the first lattice constant is equal to or greater than 1, and less than 1.04.

4. The method of claim 1, comprising stressing the dielectric layer after the heating by at least one of compressing, straining, stretching, and expanding the dielectric layer, and wherein the dielectric layer after the heating comprises a ferroelectric domain.

5. The method of claim 2, wherein the dielectric layer comprises hafnium-silicon-oxide and the ratio of the second lattice constant divided by the first lattice constant is equal to or greater than 1, and less than 1.04, and wherein the dielectric layer comprises silicon in a concentration in the range of 0.5% to 20% and wherein the doping of the dielectric layer is conducted during the forming of the dielectric layer.

6. The method of claim 1, wherein the dielectric layer comprises any from the group comprising a transition metal oxide, zirconium, zirconium oxide, hafnium, hafnium oxide, lead zirconium titanate, tantalum oxide, barium strontium titanate, and silicon nitride, and wherein the dopant comprises any from the group comprising silicon, aluminium, lanthanum, yttrium, erbium, calcium, magnesium, strontium, and a rare earth element.

7. The method of claim 6, wherein a concentration of the dopant of the dielectric layer is in the range of 0.5% to 20%.

8. The method of claim 1, further comprising:
forming a stress inducing layer on the covering layer; and
removing the stress inducing layer after the heating of the dielectric layer to the second temperature.

9. The method of claim 1, wherein the integrated circuit device is any of the group comprising a capacitor and a transistor.

10. A method of fabricating an integrated circuit device, the method comprising:
forming a dielectric layer on a semiconductor substrate, the dielectric layer being in an amorphous state and having a crystallization temperature, at and above which the dielectric layer undergoes a transition from the amorphous state to a crystalline state;
doping the dielectric layer with a dopant; and
forming a conductive layer on the dielectric layer at a first temperature, the first temperature being equal to or greater than the crystallization temperature such that while forming the conductive layer a crystalline state is induced in the dielectric layer.

11. The method of claim 10, wherein a first lattice constant of the crystalline state is perpendicular to an interface between the dielectric layer and the substrate and a second lattice constant of the crystalline state is parallel to the interface, and wherein a ratio of the second lattice constant divided by the first lattice constant is equal to or greater than 1, and less than 1.1.

12. The method of claim 11, wherein the ratio of the second lattice constant divided by the first lattice constant is equal to or greater than 1, and less than 1.04.

13. The method of claim 10, wherein forming the dielectric layer on the semiconductor substrate comprises forming the dielectric layer on an electrode formed in the semiconductor substrate.

14. The method of claim 10, wherein forming the dielectric layer comprises forming a dielectric layer comprising one of a transition metal oxide, zirconium, zirconium oxide, hafnium, hafnium oxide, lead zirconium titanate, tantalum oxide, barium strontium titanate, and silicon nitride.

15. The method of claim 10, wherein doping the dielectric layer comprises doping the dielectric layer with a dopant comprising one of silicon, aluminium, lanthanum, yttrium, erbium, calcium, magnesium, strontium, and a rare earth element.

16. The method of claim 10, wherein forming the conductive layer comprises forming a conductive layer comprising one of titanium nitride, tantalum nitride, tungsten nitride, niobium nitride, carbon, iridium, and ruthenium.

17. The method of claim 10, wherein a concentration of the dopant of the dielectric layer is in the range of 0.5% to 20%.

18. The method of claim 11, wherein the dielectric layer comprises hafnium-silicon-oxide and the ratio of the second lattice constant divided by the first lattice constant is equal to or greater than 1, and less than 1.04, and wherein the dielectric layer comprises silicon in a concentration in the range of 0.5% to 20% and wherein the doping of the dielectric layer is conducted during the forming of the dielectric layer.

19. A method of fabricating a transistor, the method comprising:
depositing a dielectric layer over a semiconductor substrate including a first source/drain region and a second source/drain region, the dielectric layer being in an amorphous state and having a crystallization temperature, at and above which the dielectric layer undergoes a transition from the amorphous state to a crystalline state;
doping the dielectric layer with a dopant;
depositing a gate electrode layer over the dielectric layer at a first temperature, the first temperature being below the crystallization temperature; and
heating the dielectric layer to a second temperature, the second temperature being equal to or greater than the crystallization temperature.

20. A method of fabricating a transistor, the method comprising:
forming an insulating layer over a semiconductor substrate including a first source/drain region and a second source/drain region;
depositing a dielectric layer over the insulating layer, the dielectric layer being in an amorphous state and having a crystallization temperature, at and above which the dielectric layer undergoes a transition from the amorphous state to a crystalline state;
doping the dielectric layer with a dopant;
depositing a gate electrode layer over the dielectric layer at a first temperature, the first temperature being below the crystallization temperature; and
heating the dielectric layer to a second temperature, the second temperature being equal to or greater than the crystallization temperature, wherein the dielectric layer after the heating comprises a ferroelectric domain.

21. A method of fabricating a capacitor, the method comprising:

depositing a dielectric layer over a first electrode layer, the dielectric layer being in an amorphous state and having a crystallization temperature, at and above which the dielectric layer undergoes a transition from the amorphous state to a crystalline state;

doping the dielectric layer with a dopant;

depositing a second electrode layer over the dielectric layer at a first temperature, the first temperature being below the crystallization temperature; and heating the dielectric layer to a second temperature, the second temperature being equal to or greater than the crystallization temperature.

22. The method of claim 21, wherein the capacitor comprises a planar capacitor.

23. The method of claim 21, wherein the capacitor comprises a trench capacitor.

* * * * *